US012744526B2

(12) United States Patent
Magod Ramakrishna et al.

(10) Patent No.: US 12,744,526 B2
(45) Date of Patent: Sep. 22, 2026

(54) ADJUSTABLE POWER FET DRIVER

(71) Applicant: Texas Instruments Incorporated, Dallas, TX (US)

(72) Inventors: Raveesh Magod Ramakrishna, Dallas, TX (US); Maik Peter Kaufmann, Freising (DE); Michael Lueders, Freising (DE); Johan Strydom, Saratoga, CA (US); Stefan Herzer, Marzling (DE)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 69 days.

(21) Appl. No.: 17/977,822

(22) Filed: Oct. 31, 2022

(65) Prior Publication Data

US 2024/0146298 A1 May 2, 2024

(51) Int. Cl.
*H03K 17/687* (2006.01)
*H03K 5/00* (2006.01)
*H03K 5/13* (2014.01)

(52) U.S. Cl.
CPC ........... *H03K 17/6871* (2013.01); *H03K 5/13* (2013.01); *H03K 2005/00019* (2013.01)

(58) Field of Classification Search
CPC ................ H03K 17/6871; H03K 5/13; H03K 2005/00019
See application file for complete search history.

(56) References Cited

U.S. PATENT DOCUMENTS 5,764,007 A * 6/1998 Jones .................. H02P 23/0077 318/109
5,926,012 A * 7/1999 Takizawa ............. H03K 17/166 323/284
7,151,401 B2 * 12/2006 Inoue .................. H03K 17/164 327/434
8,970,281 B2 * 3/2015 Kawamoto ............ H03K 3/012 327/434
(Continued)

OTHER PUBLICATIONS

International Searching Authority, Search Report for T101957WO, mailed Jan. 26, 2024, 3 pages.
(Continued)

*Primary Examiner* — Menatoallah Youssef
*Assistant Examiner* — Colleen J O Toole
(74) *Attorney, Agent, or Firm* — Zhenhai Fu; Frank D. Cimino

(57) ABSTRACT

In described examples, an integrated circuit includes first and second current sources, first and second switches, a dV/dt phase detector, a control circuit, and source, gate, and drain terminals for coupling to, respectively, a source, gate, and drain of a power FET. The first switch is coupled between the first current source and the gate terminal. The second switch is coupled between the second current source and the gate terminal. The dV/dt phase detector detects a dV/dt phase of the power FET and outputs to the control circuit. The control circuit controls the first and second switches to perform a turn-on sequence of the power FET, including: closing the first switch while keeping the second switch open; and after receiving a signal from the dV/dt phase detector indicating the dV/dt phase has started, opening the first switch, and closing the second switch.

23 Claims, 9 Drawing Sheets

(56) References Cited

U.S. PATENT DOCUMENTS

| | | | | |
|---|---|---|---|---|
| 9,019,001 | B2 * | 4/2015 | Kelley | H03K 17/04123 327/434 |
| 9,438,228 | B2 * | 9/2016 | Peng | H03K 17/166 |
| 2007/0279106 | A1 | 12/2007 | Bennett | |
| 2009/0027096 | A1 * | 1/2009 | Mourrier | H03K 17/16 327/170 |
| 2013/0009671 | A1 * | 1/2013 | Suzuki | H03K 17/164 327/108 |
| 2015/0349772 | A1 | 12/2015 | Schubert | |
| 2016/0241230 | A1 | 8/2016 | Siebler | |
| 2023/0326973 | A1 * | 10/2023 | Zhou | H01L 29/0619 257/77 |

OTHER PUBLICATIONS

International Searching Authority, Written Opinion for T101957WO, mailed Jan. 26, 2024, 5 pages.

* cited by examiner 200
dI/dt
dV/dt

ENERGY
LOSS
202
VOLTAGE
UPPER BOUND VOLTAGE
218
220
LOWER BOUND VOLTAGE
V DS
206
CURRENT
I DS
210
VOLTAGE
V T
V GS
214
T1
T2
T3
T4
TIME

218
CURRENT
VOLTAGE
CURRENT
VOLTAGE
ENERGY
220
214
210
206
202
$I_G$
222
$V_{GS}$
$V_T$
216
$I_{DS}$
212
$V_{DS}$
UPPER BOUND VOLTAGE
LOWER BOUND VOLTAGE
208
220
218
LOSS
204
dI/dt
dV/dt
T1
T2
T3
T4
T5
TIME 800
802
808
812
GATE DRIVER OUTPUT VOLTAGE
$L_{GS}$
804
806
810
814
T0
T1
T2
T3
VOLTAGE
CURRENT
VOLTAGE

ADJUSTABLE POWER FET DRIVER

TECHNICAL FIELD

This application relates generally to power field-effect transistors (FETS), and more particularly to driving turn-on of power FETS.

BACKGROUND

A power FET is a semiconductor device designed to switch on and off, and to conduct current at a wide range of power levels, such as from a few hundred milliWatts to thousands of Watts. In some examples, a power FET is used as a control switch in a power converter, coupling and decoupling an inductor to and from a main power source of the converter. A level of a current used to drive the gate of the power FET controls whether the power FET is turned on or off. The level of the current used to drive the gate of the power FET also affects characteristics of a turn-on process of the power FET.

SUMMARY

In described examples, an integrated circuit includes first and second current sources, first and second switches, a dV/dt phase detector, a control circuit, and source, gate, and drain terminals for coupling to, respectively, a source, gate, and drain of a power FET. The first switch is coupled between the first current source and the gate terminal. The second switch is coupled between the second current source and the gate terminal. The dV/dt phase detector detects a dV/dt phase of the power FET and outputs to the control circuit. The control circuit controls the first and second switches to perform a turn-on sequence of the power FET, including: closing the first switch while keeping the second switch open; and after receiving a signal from the dV/dt phase detector indicating the dV/dt phase has started, opening the first switch, and closing the second switch.

DETAILED DESCRIPTION

Figure 1:
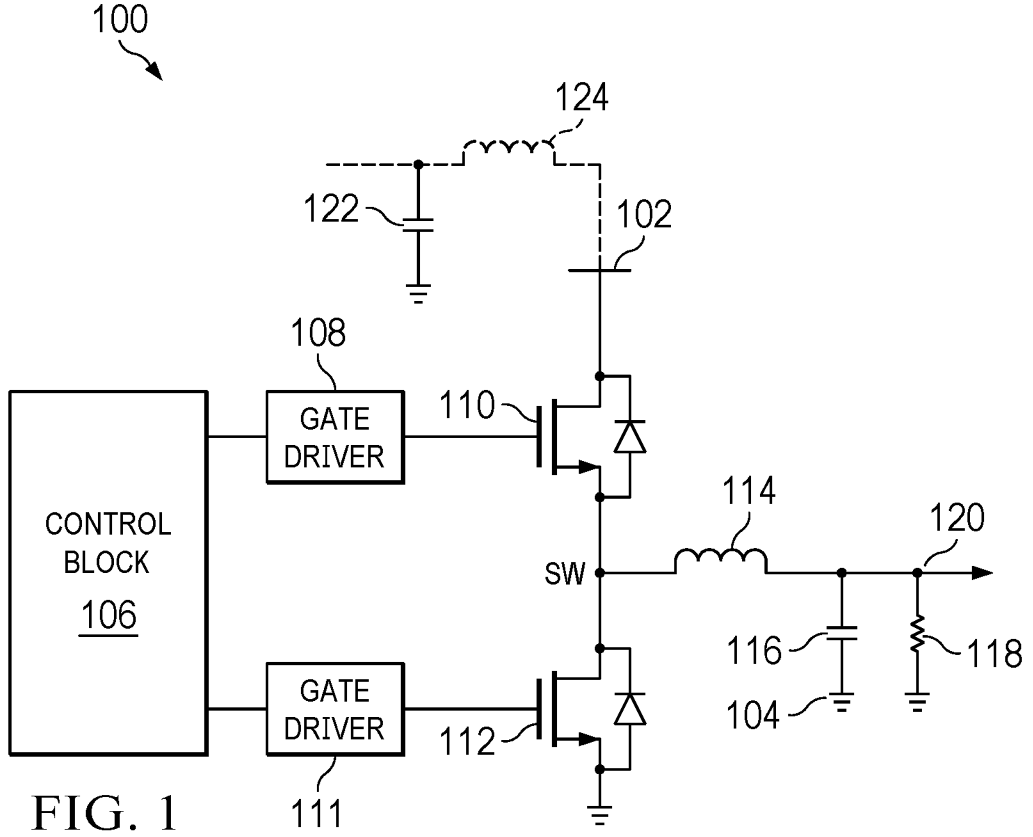
FIG. 1 is a circuit and functional block diagram of an example buck converter including a power FET.

The same reference numbers or other reference designators are used in the drawings to designate the same or similar (functionally and/or structurally) features.

FIG. 1 is a circuit and functional block diagram of an example buck converter 100. The buck converter 100 includes a voltage source 102, a ground 104, a control block 106, a high side gate driver 108, a high side n-channel type power FET (high side power NFET) 110, a low side gate driver 111, a low side n-channel type power FET (low side power NFET) 112, an inductor 114, a capacitor 116, and a load 118 (represented as a resistor 118). A first output of the control block 106 is connected to an input of the high side gate driver 108, and a second output of the control block 106 is connected to an input of the low side gate driver 111. An output of the high side gate driver 108 is connected to the gate of the high side power NFET 110, so that the high side gate driver 108 drives the high side power NFET 110. An output of the low side gate driver 111 is connected to the gate of the low side power NFET 112, so that the low side gate drier 111 drives the low side power NFET 112. The high side gate driver 108 transmits a signal to the gate of the high side power NFET 110 to activate the high side power NFET 110 in response to a signal from the control block 106, such as a pulse width modulation (PWM) signal. The low side gate driver 111 similarly transmits a signal to the gate of the low side power NFET 112 to activate the low side power NFET 112 in response to the signal from the control block 106 (or in some examples, a separate signal from the control block 106).

A drain of the high side power NFET 110 is connected to the voltage source 102. A source of the high side power NFET 110 is connected to a switch node (SW), which is located between the high side power NFET 110 source, the low side power NFET 112 drain, and a first terminal of the inductor 114. A source of the low side power NFET 112 is connected to ground 104. A second terminal of the inductor 114 is connected to a first plate of the capacitor 116 and to an output terminal 120 of the buck converter 100. A second plate of the capacitor 116 is connected to ground 104. The output terminal 120 is coupled to a first terminal of the load 118. A second terminal of the load 118 is connected to ground 104.

In some examples, the buck converter 100 also includes a relatively low-capacitance input capacitor 122 connected relatively close to the drain of the high side power NFET 110, and a parasitic inductance 124. In some examples, the parasitic inductance is between 1 nano Henry (nH) and 5 nH. A first plate of the input capacitor 122 is connected to a first terminal of the parasitic inductance 124. A second plate of the input capacitor 122 is connected to ground 104. A second terminal of the parasitic inductance 124 is connected to the drain of the high side power NFET 110.

The operation of the buck converter 100 is controlled by the closed or open states (activation states) of the high side power NFET 110 and the low side power NFET 112, corresponding to one of two respective phases. In a first phase, after the low side power NFET 112 is opened and the high side power NFET 110 is closed, current through the inductor 114 is increased, and the inductor 114 stores energy by generating a magnetic field while current flows from the voltage source 102, through the high side power NFET 110, the inductor 114, and the load 118. In a second phase, after the high side power NFET 110 is opened and the low side power NFET 112 is closed, the inductor 114 becomes a current source; the energy stored in the magnetic field of the inductor 114 supports current flow through the low side power NFET 112, the inductor 114, and the load 118.

In some examples, there is a relatively short delay after the low side power NFET 112 opens and before the high side power NFET 110 closes, or after the high side power NFET 110 opens and before the low side power NFET 112 closes. These delays are used to avoid both the high side power NFET 110 and the low side power NFET 112 being turned on at the same time, which otherwise could provide current a direct, shorted path from the voltage source 102 to ground 104 (also referred to as shoot through). This shorted current path could cause large amounts of current to pass through the high side power NFET 110 and the low side power NFET 112, potentially damaging them and other components of the buck converter 100. During delays between converter phases, current continues to flow through the inductor 114 as the inductance resists a sudden change in current due to its stored magnetic energy. Accordingly, during delays after the first phase or after the second phase, current continues to flow through the low side power NFET 112 via the body diode of the low side power NFET 112. The duty cycle of the buck converter 100 is determined by the switching pattern of the high side power NFET 110. In some examples, the high side power NFET 110 switches at 100 kHz to 1 MHz.

The high side power NFET 110 is referred to as the control FET of the buck converter 100, because the activation state of the high side power NFET 110 controls power transfer from the voltage source 102, via the inductor 114, to the load 118. Power FETS are used, for example, to enable transfer of hundreds or thousands of Watts from a power source of a power converter to a load, such as from the voltage source 102 of the buck converter 100 to the load 118. In this context, the duration of a turn-on process of a FET such as the high side power NFET 110 can affect the efficiency of the FET, and accordingly, the efficiency of a circuit containing the FET as a whole, such as the buck converter 100 of FIG. 1.

Figure 2A:
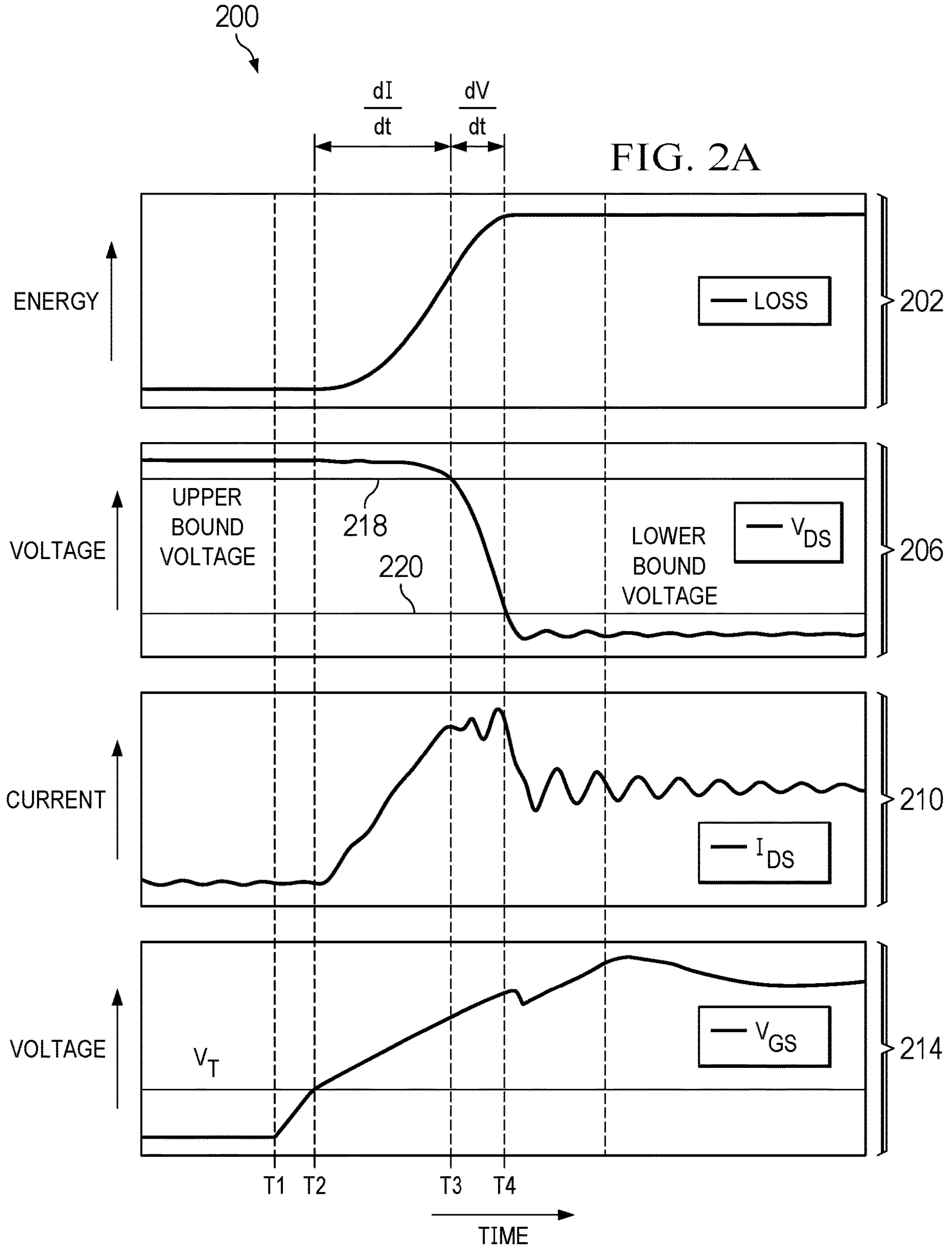
FIG. 2A is a set of graphs describing an example of a prior art turn-on process of the power FET of FIG. 1.

FIG. 2A is a set of graphs 200 describing an example of a prior art turn-on process of the high side power NFET 110 of FIG. 1. Turn-on processes described herein can also be applied to the low side power NFET 112. The horizontal axis for each of the graphs 200 represents time. A first graph 202 includes a loss curve 204 showing energy lost over time. Some lost energy is dissipated as heat. In some examples, this heat is compensated for using dedicated cooling pads or paths (not shown). The vertical axis for the first graph 202 represents energy. A second graph 206 includes a drain-source voltage ($V_{DS}$) curve 208 showing $V_{DS}$ of the high side power NFET 110. The vertical axis for the second graph 206 represents voltage. A third graph 210 includes a drain-source current ($I_{DS}$) curve 212 showing $I_{DS}$ of the high side power NFET 110. The vertical axis for the third graph 210 represents current. A fourth graph 214 includes a gate-source voltage ($V_{GS}$) curve 216 showing $V_{GS}$ of the high side power NFET 110. The vertical axis for the fourth graph 214 represents voltage.

Figure 2B:
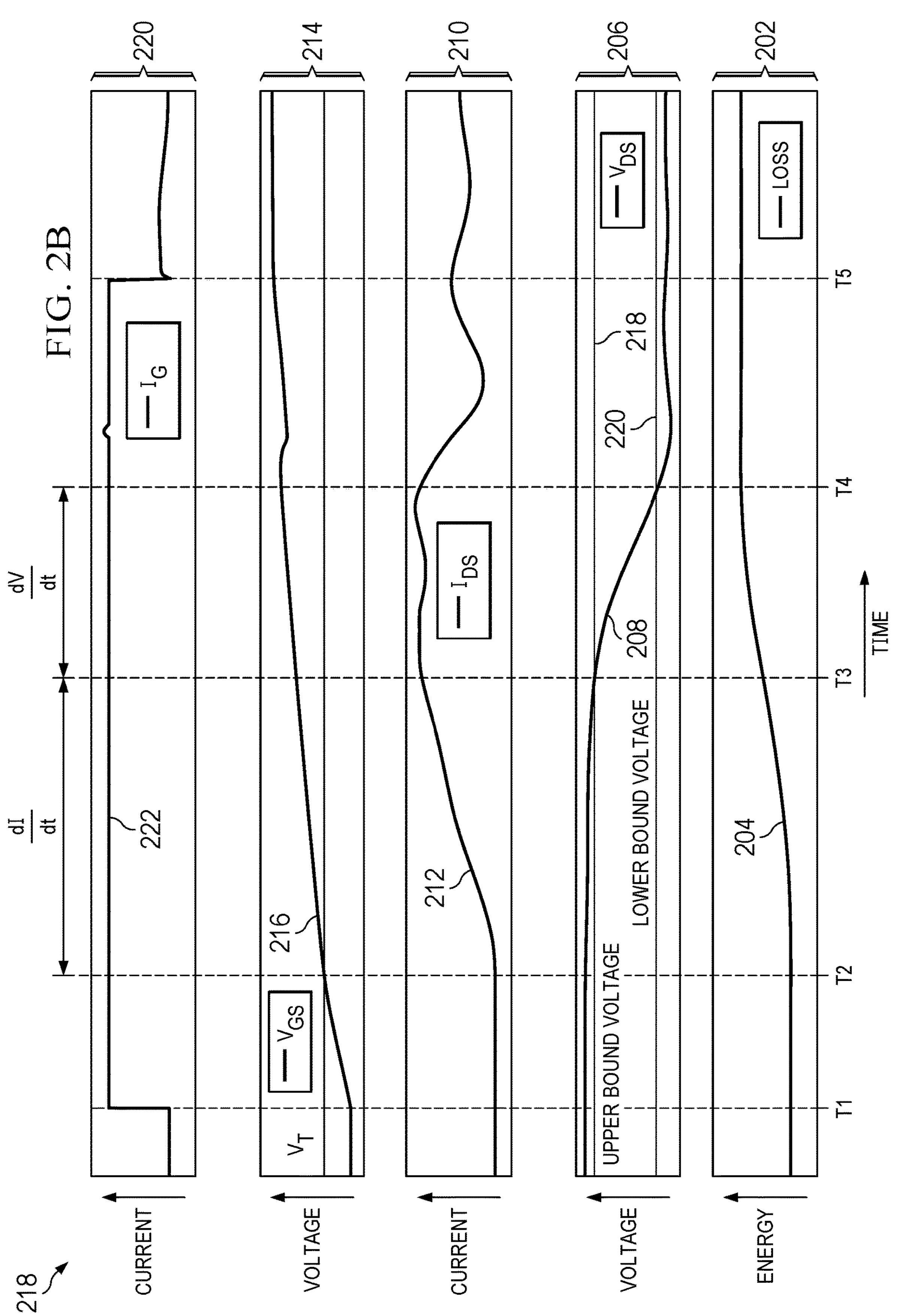
FIG. 2B is a set of graphs describing another example of the prior art turn-on process of FIG. 2A.

At time T1, the gate driver 108 begins to output a signal to the gate of the high side power NFET 110 with a constant gate driving current $I_G$. Between times T1 and T2, the gate driving current $I_G$ charges the gate-source capacitance $C_{GS}$ of the high side power NFET 110, increasing $V_{GS}$ 216 of the high side power NFET 110. $I_G$ is not shown in FIG. 2A, but an $I_G$ curve 222, showing $I_G$ behavior as described with respect to FIG. 2A, is shown in FIG. 2B. At time T2, $V_{GS}$ 216 of the high side power NFET 110 exceeds the threshold voltage $V_T$ of the high side power NFET 110, and a drain-source path of the high side power NFET 110 begins to conduct positive $I_{DS}$ 212. $I_{DS}$ 212 continues to increase until it is equal to the current through the inductor 114 plus additional current that charges an equivalent capacitance across the off-state low side power NFET 112. Once $I_{DS}$ 212 exceeds the inductor current, $V_{DS}$ 208 starts to decrease. The period during which $I_{DS}$ 212 increases is referred to as the dI/dt phase. The rate at which $I_{DS}$ increases (dI/dt) is limited by the parasitic inductance 124, and is primarily dependent on the input voltage available at the input capacitor 122 and on $I_G$. During the dI/dt phase, power is transmitted to the inductor 114 and also lost across the high side power NFET 110. Energy loss across the high side power NFET 110 during the dI/dt phase is caused by current flowing through the high side power NFET 110 while the voltage across the high side power NFET 110 is still relatively high. This is called a V×I overlap loss.

The next phase, between T3 and T4, is a voltage change phase, referred to as the dV/dt phase. During the dV/dt phase, $I_G$ charges the gate-drain capacitance ($C_{GD}$) of the high side power NFET 110. Charging of gate-drain capacitance ($C_{GD}$) of the high side power NFET 110 causes $V_{DS}$ 208 to decrease. The dV/dt phase is considered to last from a selected upper bound percentage of a maximum $V_{DS}$ 208 (an upper bound voltage 218), such as 80% or 90% of the maximum $V_{DS}$ 208, to a selected lower bound percentage of the maximum $V_{DS}$ 208 (a lower bound voltage 220), such as 20% or 10% of the maximum $V_{DS}$ 208. The duration of the dV/dt phase is measured as the time taken for $V_{DS}$ 208 to drop from the upper bound voltage 218 to the lower bound voltage 220. At time T3, $V_{DS}$ 208 drops to the upper bound voltage 218. After time T3, $V_{DS}$ 208 continues to fall, so that at time T4, $V_{DS}$ 208 reaches the lower bound voltage 220.

During the dV/dt phase, $I_{DS}$ 212 experiences current ripple, during which $I_{DS}$ 212 exceeds a nominal maximum due to the parasitic inductance 124 resonating with the drain-source capacitance on the low side power NFET 112. The voltage slew rate, dV/dt, from T3 to T4 is maintained at a known value in order to reduce or minimize signal ringing. dV/dt is a function of $I_G$ and $C_{GD}$. In some examples, $C_{GD}$ is designed to be much smaller than $C_{GS}$, but $C_{GD}$ is multiplied by large gain during the dV/dt phase.

After time T4, including some delay, the gate driver 108 exits the constant current mode, and transitions to a resistive pull-up mode to maintain the high side power NFET 110 in the on-state. In an example, with a constant $I_G$ during turn-on of a 40 milliOhm high side power nFET 110 at 400 Volts (V) initial $V_{DS}$, with $I_G$ equal to 1.3 Amperes (A) and a target $I_{DS}$ of 20 A, at 27° Celsius (C), and a designed dV/dt of approximately 100 V per nanosecond (ns), dI/dt phase loss equals 52 microJoules (μJ), and dV/dt phase loss equals 27 μJ. Herein, approximately means equal to within design and manufacturing tolerances.

FIG. 2B is a set of graphs 218 describing another example of the prior art turn-on process of FIG. 2A. Principles of signal and high side power NFET 110 behavior as described with respect to FIG. 2A also apply to and are expressed in the graphs in FIG. 2B. A fifth graph 220 includes the $I_G$ curve 222 showing $I_G$ (gate current) of the high side power NFET 110. The vertical axis for the fifth graph 220 represents current. The transition in $I_G$ from the constant current mode to the resistive pull-up mode can be seen at time T5.

Figure 3:
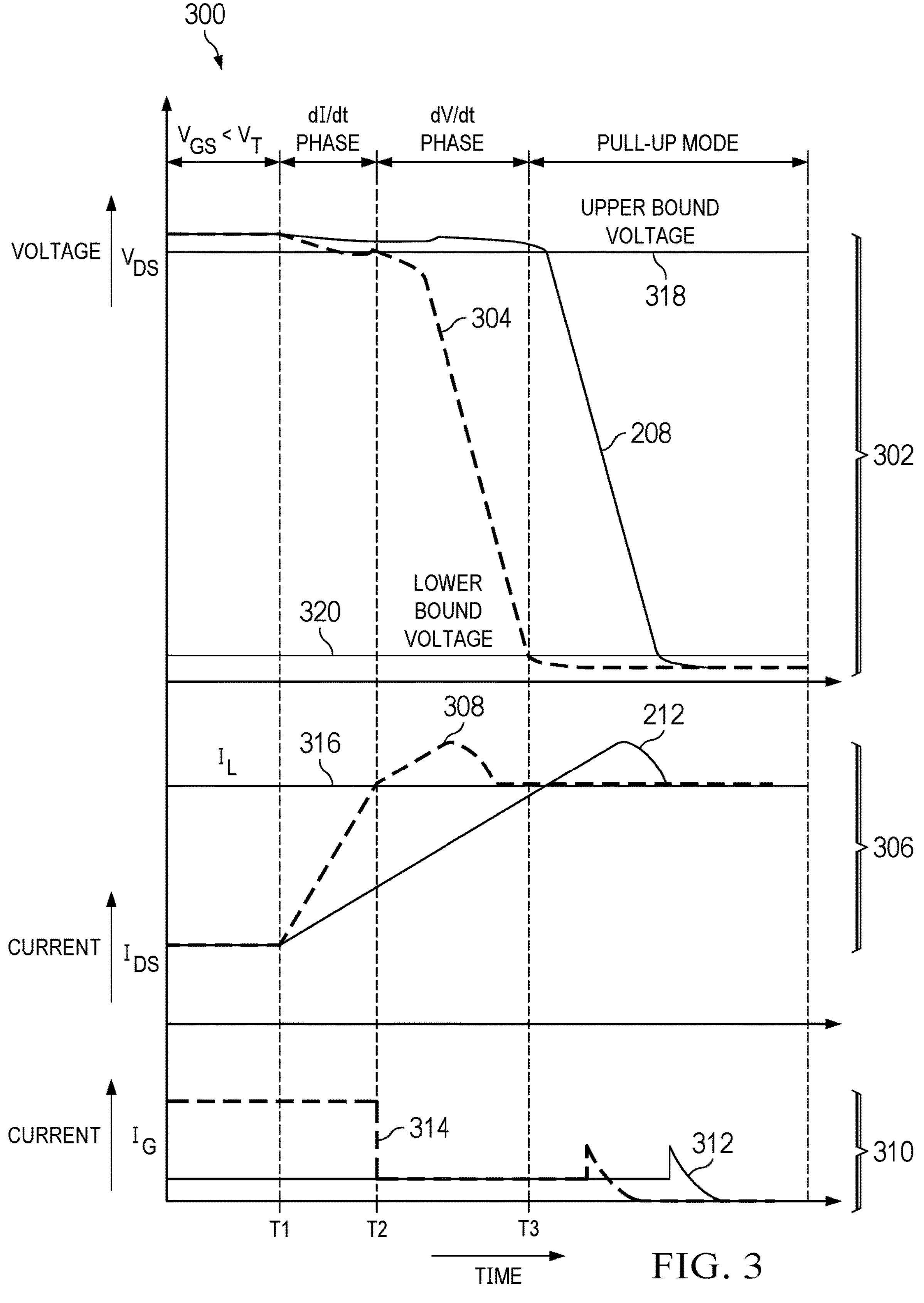
FIG. 3 is a set of graphs comparing another example turn-on process of the power FET of FIG. 1 to the example process of FIGS. 2A and 2B.

FIG. 3 is a set of graphs 300 comparing another example turn-on process of the high side power NFET 110 of FIG. 1 to the example process of FIGS. 2A and 2B. The horizontal axis for each of the graphs 300 represents time. A first graph 302 compares a first $V_{DS}$ curve 208 (from FIG. 2) to a second $V_{DS}$ curve 304. A second graph 306 compares a first $I_{DS}$ curve 212 (from FIG. 2) to a second $I_{DS}$ curve 308. A third graph 310 compares a first gate driving current $I_{G1}$ curve 312, corresponding to the gate driving current described with respect to FIGS. 2A and 2B, to a second gate driving current $I_{G2}$ curve 314.

Initially, $I_{G2}$ is set to a higher value than $I_{G1}$. The times when $V_{GS}$ for the high side power NFET 110 reaches $V_T$, driven by either $I_{G1}$ or $I_{G2}$, are aligned at T1 to facilitate comparing the effects of the different gate driving currents on corresponding dI/dt and dV/dt phases. Without such alignment the higher gate driving current $I_{G2}$ would charge $C_{GS}$ of the high side power NFET 110 faster, so that $V_{GS}$ would exceed $V_T$ sooner. After T1, the relatively higher $I_{G2}$ continues to charge $C_{GS}$ faster than $I_{G1}$, so that $I_{DS}$ corresponding to $I_{G2}$ increases with a steeper slope than the $I_{DS}$ corresponding to $I_{G1}$. Accordingly, the dI/dt phase corresponding to $I_{G2}$ (the period during which $I_{G2}$ rises) is shorter than the dI/dt phase corresponding to $I_{G1}$, which reduces energy loss relative to the example turn-on process of FIGS. 2A and 2B.

At time T2, the second $I_{DS}$ curve 308 equals $I_L$ 316. $I_L$ 316 equals the current intended to be provided through the high side power NFET 110 to the inductor 114 during steady state operation (while the high side power NFET 110 is fully turned on) plus additional current to charge the drain-source capacitance $C_{DS}$ of the low side power NFET 112. A current or voltage sensing circuit (not shown) detects when $V_{DS}$ 304 starts to fall, or a current sensing circuit (not shown) detects that $I_{DS}$ 308 equals $I_L$. In response, the gate driver 108 lowers $I_{G2}$ to equal the turn-on current level of $I_{G1}$. This lower current level is known to produce a dV/dt resulting in a desired ringing performance in the signal output by the drain-source path of the high side power NFET 110 (as described above, dV/dt is a function of $I_G$ and $C_{GD}$). Accordingly, the $I_{G2}$ curve 314 produces a dI/dt phase that is shorter than the dI/dt phase produced by the $I_{G1}$ curve 312, and the $I_{G2}$ curve 314 produces a dV/dt phase that has approximately the same duration as the dV/dt phase produced by the $I_{G1}$ curve 312. At time T2, the second $V_{DS}$ curve 304 equals an upper bound voltage 318 for the dV/dt phase produced by the $I_{G2}$ curve 314.

At time T3, the second $V_{DS}$ curve 304 reaches a lower bound voltage 320 for the dV/dt phase produced by the $I_{G2}$ curve 314. After a delay, $I_{G2}$ is switched to a resistive pull-up network, as described with respect to post-T4 behavior in FIGS. 2A and 2B. $I_{G2}$ then transitions to the intended pull-up level for maintaining the high side power NFET 110 in the on-state. In some examples, the delay between the end of the dV/dt phase and the switch of $I_{G2}$ to the pull-up current corresponds to time taken detecting the end of the dV/dt phase and enabling the pull-up current. In some examples, the current spike during the transition between the lower current level and the pull-up current corresponds to a resistor-capacitor (RC) charging current that rapidly peaks and then exponentially decays.

Figure 4:
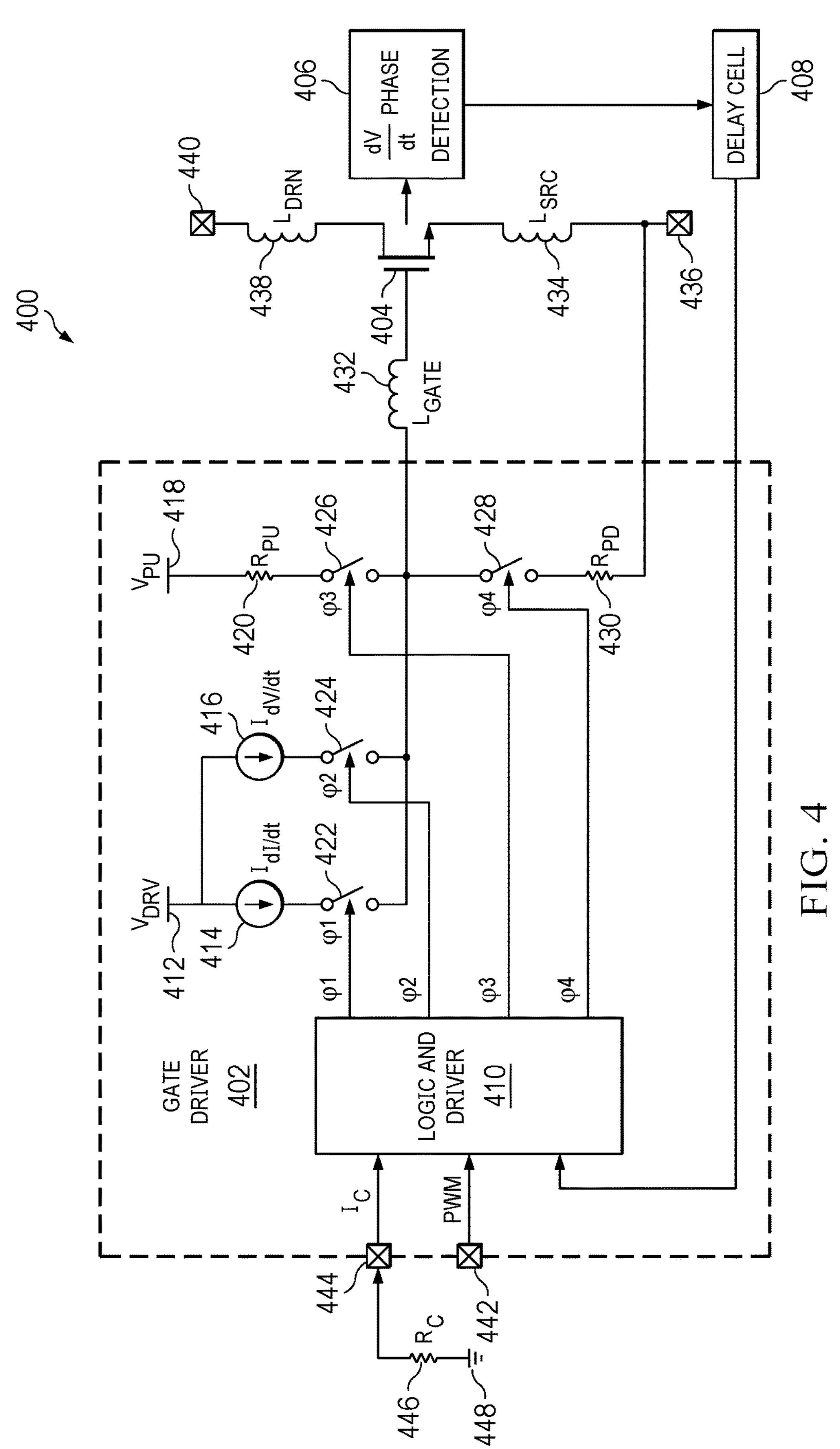
FIG. 4 is a circuit and functional block diagram of an example power FET drive circuit.

FIG. 4 is a circuit and functional block diagram of an example power FET drive circuit 400. The power FET drive circuit 400 includes a gate driver 402, an n-channel power FET (power FET) 404, a dV/dt phase detection block 406, and a delay cell 408. In an example, the power FET 404 is a 650 V gallium nitride (GaN) device. The gate driver 402 includes a logic and driver block 410, a turn-on driver voltage input 412 providing a turn-on gate voltage $V_{DRV}$, a first current source 414 that provides a first current during the dI/dt phase ($I_{dI/dt}$), a second current source 416 that provides a second current during the dV/dt phase ($I_{dV/dt}$), a pull-up voltage input 418 that provides a pull-up voltage ($V_{PU}$), a pull-up resistor 420 for providing a pickup current with a resistance $R_{PU}$, a first phase control switch 422, a second phase control switch 424, a third phase control switch 426, a fourth phase control switch 428, and a pull-down resistor 430 with resistance $R_{PD}$. A source terminal 436 acts as a low voltage reference for the power FET drive circuit 400. This low voltage reference is not necessarily (but in some examples is) connected to ground. Operation of the power FET drive circuit 400 is shown in and described with respect to FIG. 5, below.

$V_{DRV}$ is connected to a first terminal of the first current source 414 ($I_{dI/dt}$) and a first terminal of the second current source 416 ($I_{dV/dt}$). A second terminal of the first current source 414 is connected to a first terminal of the first phase control switch 422. A second terminal of the second current source 416 is connected to a first terminal of the second phase control switch 424. $V_{DRV}$ is connected to a first terminal of the pull-up resistor 420. A second terminal of the pull-up resistor 420 is connected to a first terminal of the third phase control switch 426. A second terminal of the first phase control switch 422 is connected to a second terminal of the second phase control switch 424, a second terminal of the third phase control switch 426, a first terminal of the fourth phase control switch 428, and a first terminal of a parasitic gate inductance ($L_{GATE}$) 432 of a conductive line connected to the gate of the power FET 404.

A second terminal of the fourth phase control switch 428 is connected to a first terminal of the pull-down resistor 430. A second terminal of the pull-down resistor 430 is connected to a first terminal of a parasitic source inductance ($L_{SRC}$) 434 of a conductive line connected to the source of the power FET 404, and to the source terminal 436. In some examples, such as in the buck converter 100 of FIG. 1, $L_{SRC}$ is a common source inductance. A second terminal of $L_{GATE}$ 432 is connected to the gate of the power FET 404. A second terminal of $L_{SRC}$ 434 is connected to the source of the power FET 404. The drain of the power FET 404 is connected to a first terminal of a parasitic drain inductance ($L_{DRN}$) 438 of a conductive line connected to the drain of the power FET 404. A second terminal of $L_{DRN}$ 438 is connected to a drain terminal 440. In some examples, the gate driver 402 and the power FET 404 are on the same die. In some examples, the gate driver 402 and the power FET 404 are on different dies.

A first input of the logic and driver 410 receives a pulse width modulation (PWM) control signal from a control input terminal 442. In some examples, the control input terminal 442 is one or more of a node, terminal, pin, pad, or via. A first output of the logic and driver 410 is connected to provide a first phase control signal (ϕ1) to a control terminal of the first phase control switch 422. A second output of the logic and driver 410 is connected to provide a second phase control signal (ϕ2) to a control terminal of the second phase control switch 424. A third output of the logic and driver 410 is connected to provide a third phase control signal (ϕ1) to a control terminal of the third phase control switch 426. A fourth output of the logic and driver 410 is connected to provide a fourth phase control signal (ϕ1) to a control terminal of the fourth phase control switch 428.

The dV/dt phase detection block 406 is connected to detect when a turn-on process of the power FET 404 enters the dV/dt phase. Further description of dV/dt phase detection is provided with respect to FIGS. 6 and 7. An output of the dV/dt phase detection block 406 is connected to an input of the delay cell 408. An output of the delay cell 408 is connected to a second input of the logic and driver 410.

A third input of the logic and driver 410 is connected to a current-setting terminal 444. The current-setting terminal 444 is connected to a first terminal of a current-setting resistor 446 with resistance $R_C$. A second terminal of the current-setting resistor 446 is connected to a ground 448. The current-setting resistor 446 can be located external to an integrated circuit that includes other components of the power FET drive circuit 400. The logic and driver 410 provides a current across the current-setting resistor 446, and uses the resulting voltage to determine one or more of $V_{DRV}$, $I_{dI/dt}$, and $I_{dV/dt}$. This enables turn-on properties of the power FET 404 to be determined post-fabrication, such as during test or by a downstream manufacturer or user.

Figure 5A:
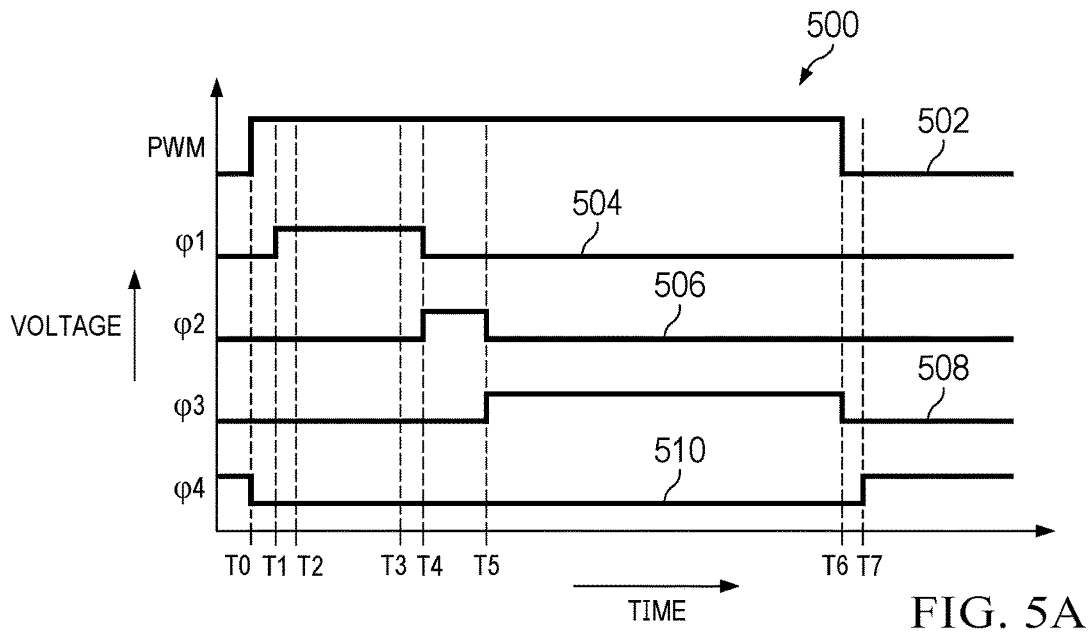
FIG. 5A is a timing diagram describing an example turn-on process of the power FET of FIG. 4.

FIG. 5A is a timing diagram 500 describing an example turn-on process of the power FET 404 of FIG. 4. The horizontal axis for the timing diagram 500 represents time, and the vertical axis represents voltage. The timing diagram 500 includes a PWM control signal curve 502, a ϕ1 curve 504, a ϕ2 curve 506, a ϕ3 curve 508, and a ϕ4 curve 510. The PWM control signal curve 502 corresponds to the PWM control signal received by the first input of the logic and driver 410. The ϕ1 curve 504, ϕ2 curve 506, ϕ3 curve 508, and ϕ4 curve 510 correspond, respectively, to the ϕ1, ϕ2, ϕ3, and ϕ4 control signals output by the logic and driver 410 to, respectively, the first, second, third, and fourth phase control switches 422, 424, 426, and 428. Timing of these control signals is described together with the description of FIG. 5B.

Figure 5B:
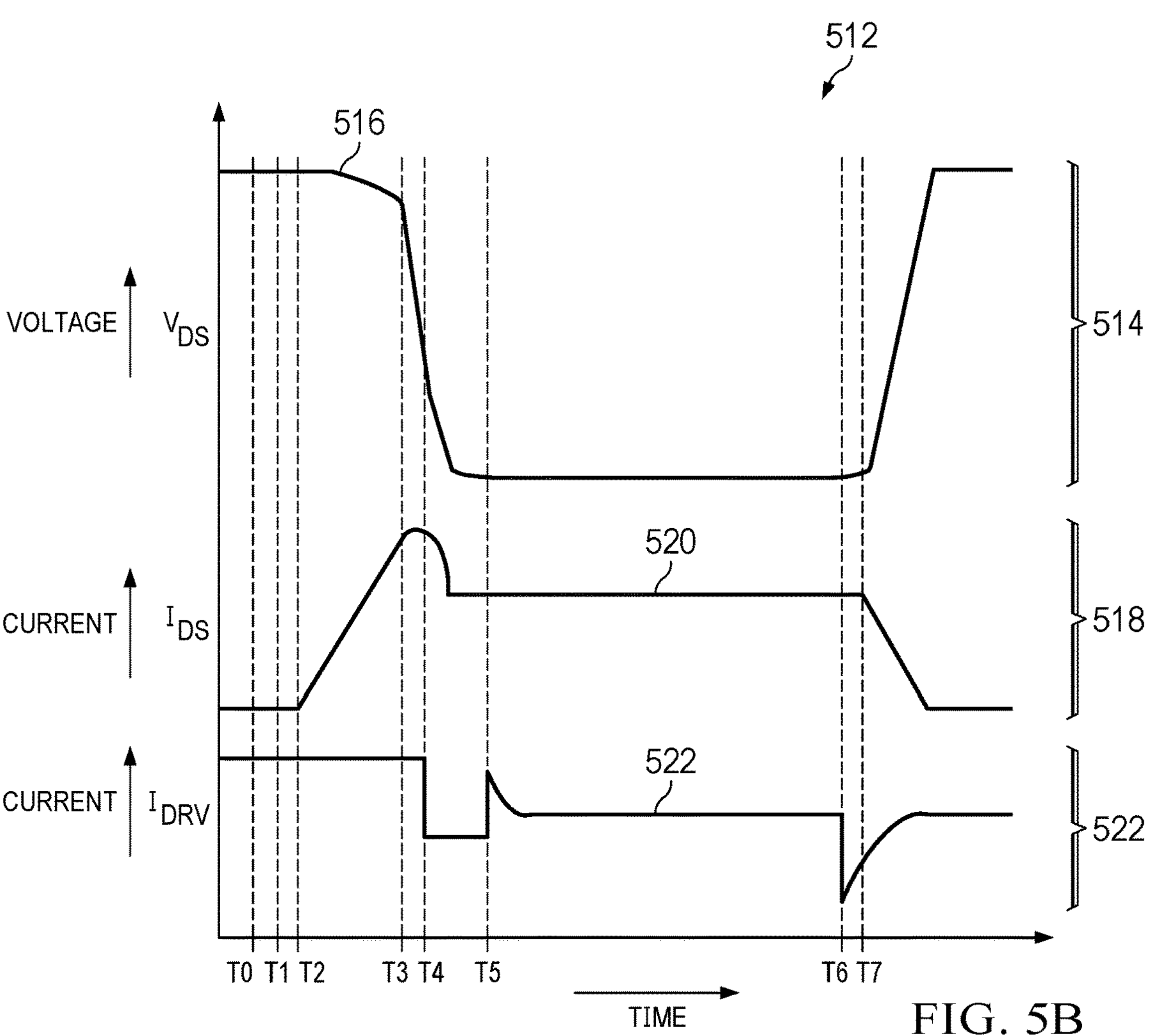
FIG. 5B is a set of graphs resulting from the example turn-on process of FIG. 5A.

FIG. 5B is a set of graphs 512 resulting from the example turn-on process of FIG. 5A. The horizontal axis for each of the graphs 512 is time. A first graph 514, in which the vertical axis is voltage, includes a $V_{DS}$ curve 516 of the power FET 404. A second graph 518, in which the vertical axis is current, includes an $I_{DS}$ curve 520 of the power FET 404. A third graph 522, in which the vertical axis is current, includes an $I_G$ curve 524 of the power FET 404.

Prior to time T0, the PWM control signal 502 is deasserted (a relatively low voltage), which causes the logic and driver 410 to assert (a relatively high voltage) ϕ4 510. This keeps the fourth switch 428 closed, while the first, second, and third switches 422, 424, and 426 are open because their respective control signals are deasserted. While the fourth switch 428 is closed, the gate of the power FET 404 is discharged via the pull-down resistor 430, so that the power FET 404 is maintained in an off (nonconductive) state.

At time T0, the PWM control signal 502 is asserted, which causes the logic and driver 410 to deassert ϕ4 510. There is a brief delay between times TO and T1 to prevent the first switch 422 and the fourth switch 428 from being closed simultaneously—that is, to avoid shoot through from the first current source 414 to the source terminal 436 (the low voltage reference for the power FET drive circuit 400). At time T1, the logic and driver 410 asserts ϕ1 510, causing the first switch 422 to close, which connects the first current source 414 to the gate of the power FET 404. Similarly to $I_{G2}$ of FIG. 3 during the dI/dt phase, the magnitude of $I_{dI/dt}$ provided by the first current source 414 is relatively higher than would be that of a constant current used to activate the power FET 404 with a selected dV/dt phase duration. This relatively higher drive current shortens the dI/dt phase, reducing corresponding losses. At time T2, $V_{GS}$ of the power FET 404 reaches $V_{TH}$, and $I_{DS}$ starts to increase.

Figure 6:
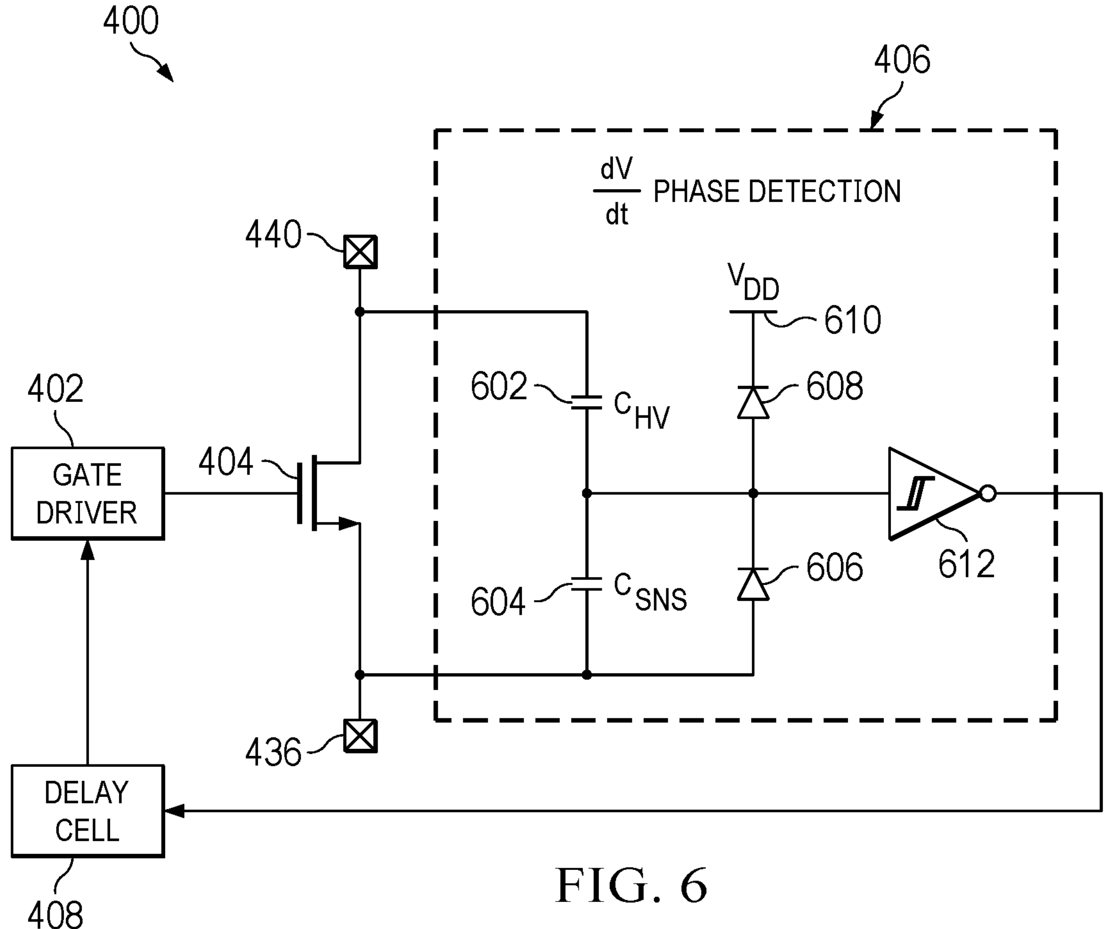
FIG. 6 is a circuit and functional block diagram of the power FET drive circuit, including example detail of the dV/dt phase detection block of FIG. 4.
Figure 7:
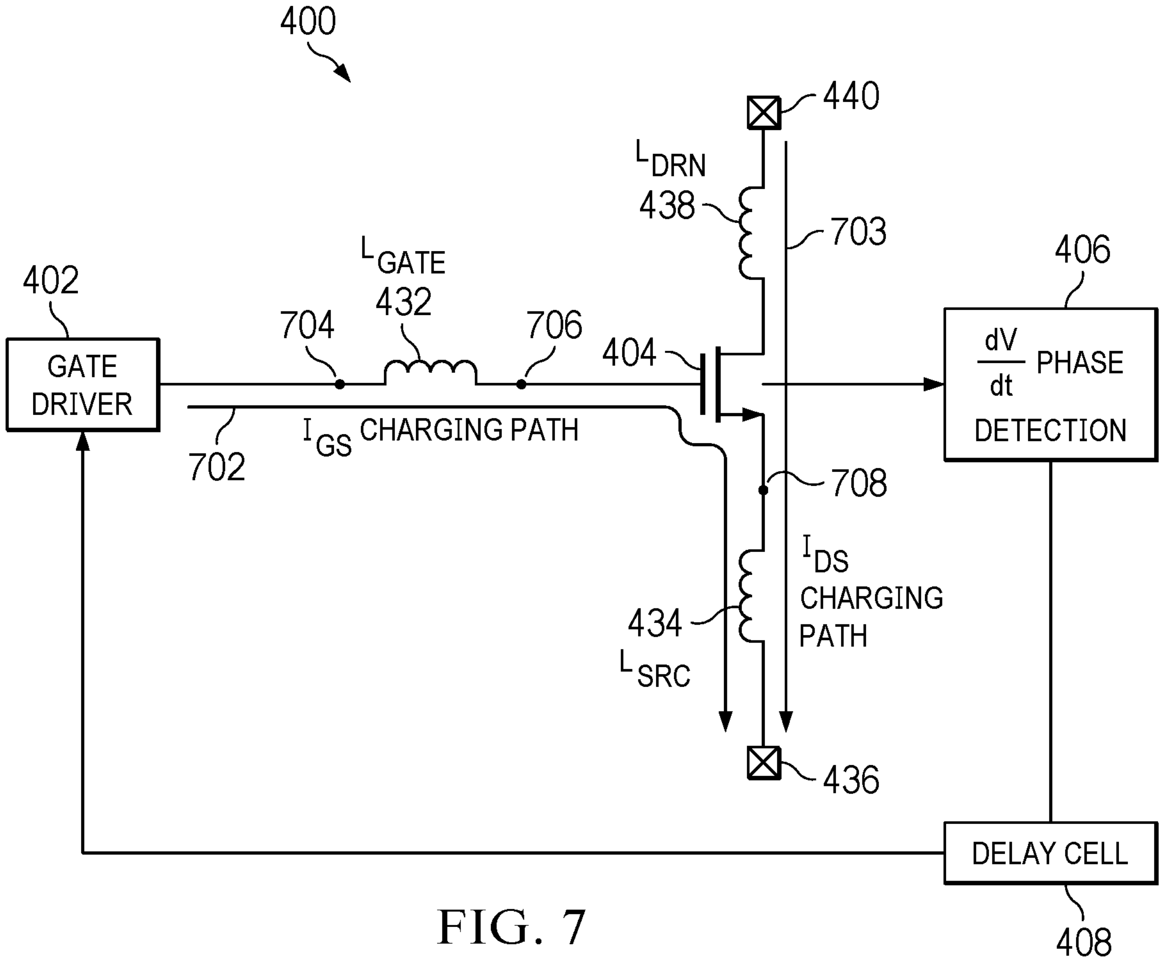
FIG. 7 is a circuit diagram of an example power FET drive circuit with voltage change phase detection, including example sensing points for detection of entry into the dV/dt phase.

At time T3, the dV/dt phase detection block 406 detects the start of the dV/dt phase, as further described with respect to FIGS. 6 and 7. The delay cell 408 introduces delay between the detected start of the dV/dt phase and resulting signal transition of the logic and driver 410—this can be seen as delay between times T3 and T4. In some examples, the delay cell 408 introduces a delay between a rising edge in an input signal received by the delay cell 408 and a rising edge in an output signal provided by the delay cell 408, but does not introduce delay between falling edges in input and output signals. This delay is used to speed up the start of the dV/dt phase without affecting the ringing profile of the signal output via the drain-source path of the power FET 404. The dV/dt phase is sped up by giving $I_{dI/dt}$ sufficient time to overcharge both $C_{GS}$ and $C_{GD}$ of the power FET 404. Overcharging these capacitances of the power FET 404 makes the power FET 404 more conductive more quickly. This causes the $V_{DS}$ curve 516 to fall more steeply than a designed dV/dt phase duration and corresponding signal ringing profile would suggest, if constant $I_{dI/dt}$ were provided throughout dV/dt—accordingly, the $V_{DS}$ curve 516 is reshaped by $I_{dV/dt}$ starting at time T4. In some examples, the start of the dV/dt phase is relatively lossy, and the delay and consequently steepened fall of the $V_{DS}$ curve 516 helps to reduce this loss by making the power FET 404 more conductive, sooner.

At time T4, the logic and driver 410 receives the delayed signal from the delay cell 408 indicating the start of the dV/dt phase, and in response, deasserts ϕ1 504 and asserts ϕ2 506. This causes the first switch 422 to open and the second switch 424 to close. Opening the first switch 422 disconnects $I_{dI/dt}$ provided by the first current source 414 from the gate of the power FET 404, and connects $I_{dV/dt}$ provided by the second current source 416 to the gate of the power FET 404. Because $I_{dI/dt}$ overcharged $C_{GD}$, causing $V_{DS}$ to fall at a rate that would cause the dV/dt phase to end too soon (which would affect ringing performance), $I_{dV/dt}$ is negative. Accordingly, $I_{dV/dt}$ readjusts capacitance charges and makes the $V_{DS}$ curve 516 shallower, so that the dV/dt phase ends after the designed interval.

After the dV/dt phase ends, at time T5, the logic and driver 410 deasserts ϕ2 506 and asserts ϕ3 508. (The end of the dV/dt phase can be detected using an appropriate sensing circuit, which is not shown.) This opens the second switch 424 and closes the third switch 426. Accordingly, a resistive pull-up path to the gate of the power FET 404 is enabled to maintain the power FET 404 in the fully on state. At time T6, the PWM control signal 502 is deasserted, which causes the logic and driver 410 to deassert ϕ3 508 and—shortly thereafter, at time T7—assert ϕ4 510, discharging the gate of the power FET 404 (including $C_{GS}$ and $C_{GD}$) and turning off the power FET 404.

FIG. 6 is a circuit and functional block diagram of the power FET drive circuit 400, including example detail of the dV/dt phase detection block 406 of FIG. 4. The power FET drive circuit 400 includes the gate driver 402, the power FET 404, the dV/dt phase detection block 406, and the delay cell 408. Line inductances and gate driver 402 inputs are omitted for clarity. The dV/dt phase detection block 406 includes a first capacitor 602 with a capacitance $C_{HV}$ (high voltage capacitance), a second capacitor 604 with a capacitance $C_{SNS}$ (sense capacitance), a first diode 606, a second diode 608, a supply voltage $V_{DD}$ 610, and a Schmitt trigger 612. As described above, the voltage at the source terminal 436 acts as the relative ground voltage (a low voltage reference) for the power FET drive circuit 400. In some examples, the first capacitor 602 is a metal-insulator-metal (MIM) or a fringe capacitor.

A first plate of the first capacitor 602 is connected to the drain of the power FET 404 and the drain terminal 440. A second plate of the first capacitor 602 is connected to a first plate of the second capacitor 604, a cathode of the first diode 606, an anode of the second diode 608, and an input of the Schmitt trigger 612. A second plate of the second capacitor 604 is connected to the source of the power FET 404, the source terminal 436, and the anode of the first diode 606. A cathode of the second diode 608 is connected to the input voltage 610. An inverted output of the Schmitt trigger 612 provides the output of the dV/dt phase detection block 406.

While the power FET 404 is off, there is a voltage drop across the first capacitor 602 and the second capacitor 604 equal to the voltage drop from the drain terminal 440 to the source terminal 436, i.e., $V_{DS}$ of the power FET 404. The second capacitor 604 is clamped on the high side by the supply voltage $V_{DD}$ 610 (plus the voltage across the second diode 608), and on the low side by the voltage at the source terminal 436 (minus the voltage across the first diode 606). The voltage received by the Schmitt trigger 612 equals the voltage across the second capacitor 604. Together, the first capacitor 602 and the second capacitor 604 form a capacitive voltage divider, so that changes in voltage across the second capacitor 604 (with capacitance $C_{SNS}$)—and accordingly, a voltage received by the input of the Schmitt trigger 612—depends on a ratio between $C_{HV}$ and $C_{SNS}$. $C_{SNS}$ is selected to be relatively large, and $C_{HV}$ is selected to be relatively small. This means that while the power FET 404 is off, the voltage across the first capacitor 602 equals $V_{DS}-V_{DD}$, and the voltage across the second capacitor 604 equals $V_{DD}$.

As the power FET 404 turns on and $V_{DS}$ falls, the voltage across the first capacitor 602 decreases by $\Delta V_{DS}\times C_{SNS}/(C_{HV}+C_{SNS})$, and the voltage across the second capacitor 604 decreases by $\Delta V_{DS}\times C_{HV}/(C_{HV}+C_{SNS})$ until the second capacitor 604 is clamped by the voltage at the source terminal 436. The Schmitt trigger 612 transitions to a relatively high voltage corresponding to a logical one—notifying the gate driver 402 of the start of the dV/dt phase, after the delay introduced by the delay cell 408—after the input of the Schmitt trigger 612 falls to a voltage level corresponding to a detected start of the dV/dt phase of power FET 404 turn-on. The Schmitt trigger 612 also includes hysteresis in its trigger voltage, avoiding the Schmitt trigger 612 transitioning from outputting a logical one to a relatively low voltage corresponding to a logical zero due to random or transient events such as line noise. Accordingly, $C_{HV}$, $C_{SNS}$, and the trigger voltage of the Schmitt trigger 612 can be selected so that the Schmitt trigger 612 is triggered relatively early in the dV/dt phase, for example, when $V_{DS}$ of the power FET 404 has fallen to 90% of the value of $V_{DS}$ when the power FET 404 is turned off.

For example, $C_{SNS}$ is nine times $C_{HV}$, $V_{DS}$ of the power FET 404 while the power FET 404 is off is 400 V, $V_{DD}$ equals 5 V, and the Schmitt trigger 612 is configured to trigger on a zero voltage input (for example, in response to a reference voltage input of the Schmitt trigger 612 coupled to a ground). While the power FET 404 is off, the voltage across the first capacitor 602 is 395 V and (because the second capacitor 604 is clamped on the high side) the voltage across the second capacitor 604 is 5 V. After the power FET 404 starts to turn on, if $V_{DS}$ falls by 50 V, the voltage across the second capacitor 604 falls by 5 V (50 V×1/10), so that the voltage across the second capacitor 604 equals 0 V.

FIG. 7 is a circuit and functional block diagram of the power FET drive circuit 400 of FIG. 4, including example sensing points for detection of entry into the dV/dt phase. Current output by the gate driver 402 includes current that charges $L_{SRC}$ 434 and $C_{GS}$ of the power FET 404. This current is referred to herein as $I_{GS}$. $I_{GS}$ follows an $I_{GS}$ charging path 702. $L_{SRC}$ 434 is also charged by the drain-source current $I_{DS}$ of the power FET 404, which follows an $I_{DS}$ charging path 703.

Figure 8:
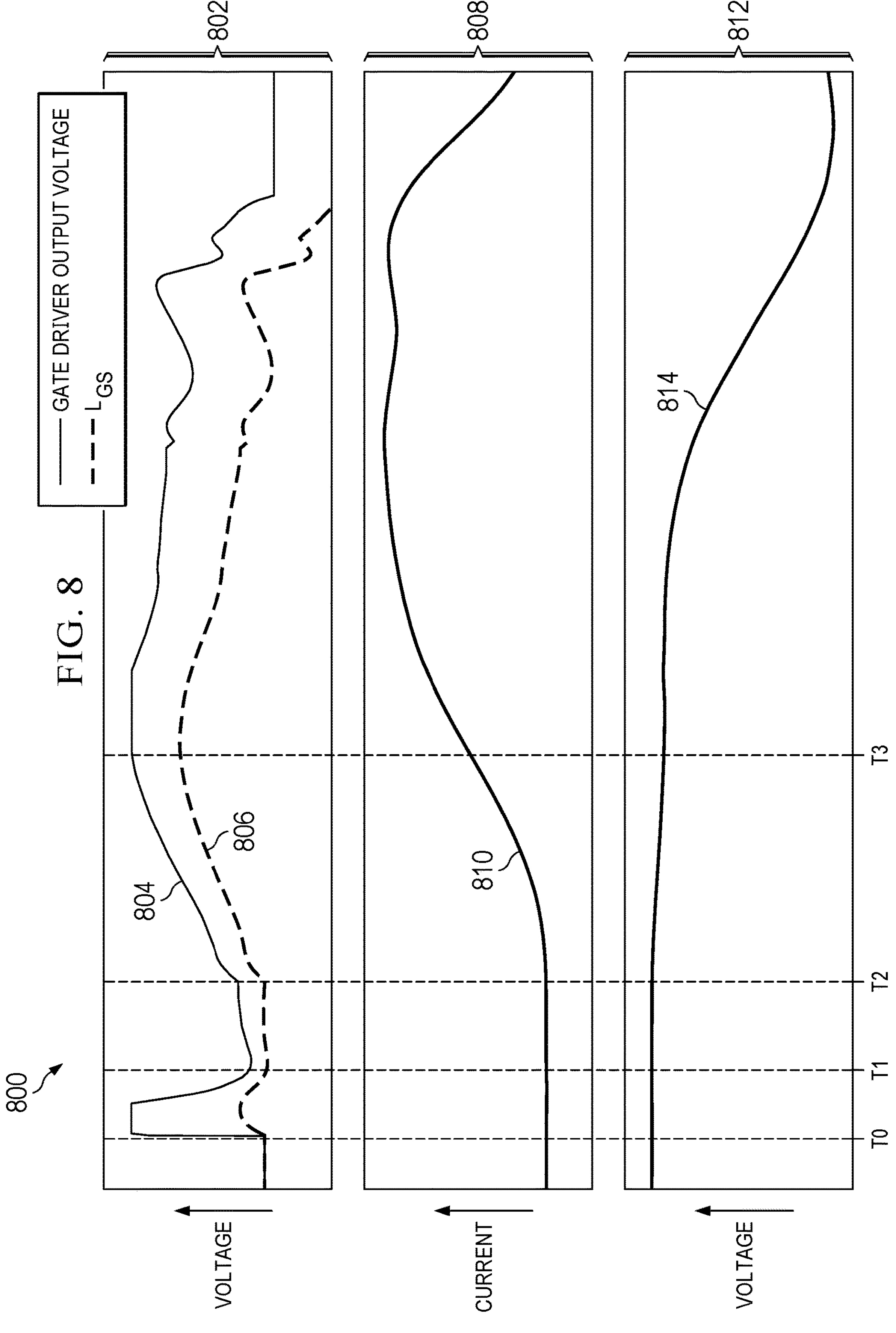
FIG. 8 is a set of graphs illustrating an example of the turn-on process of FIGS. 5A and 5B applied by the power FET drive circuit of FIG. 7.

FIG. 8 is a set of graphs 800 illustrating an example of the turn-on process of FIGS. 5A and 5B applied by the power FET drive circuit 400 of FIG. 7. The horizontal axis for the graphs 800 represents time. The graphs 800 include a first graph 802 showing a gate driver output voltage curve 804 and a common source inductance ($L_{CS}$) voltage curve 806. The $L_{CS}$ voltage curve 806 shows voltage across $L_{SRC}$ 434. The vertical axis for the first graph 802 represents voltage. A second graph 808 shows an $I_{DS}$ curve 810 of the power FET 404, for which the vertical axis represents current. A third graph 812 shows a $V_{DS}$ curve 812 of the power FET 404.

The gate driver 402 begins to provide a positive output voltage at TO, and the gate driver 402 output voltage 804 signal stabilizes at about T1. At T2, $V_{GS}$ equals $V_T$, the power FET 404 begins to conduct $I_{DS}$ 810, and the $L_{CS}$ voltage 806 starts to increase. Starting at T3, the $L_{CS}$ voltage 806 starts to decrease, indicating that the beginning of the dV/dt phase is imminent. The $L_{CS}$ voltage 806 decreases because a slope of the $I_{DS}$ curve 810 decreases; recall that voltage across an ideal inductance is related to current through the inductance as V=L×dI/dt. Referring to FIG. 7, this decrease in the $L_{CS}$ voltage 806 can be measured at, for example, a first node 704 that is between the gate driver 402 and $L_{GATE}$ 432, a second node 706 that is between $L_{GATE}$ 432 and the gate of the power FET 404, or at a third node 708 that is between the power FET 404 and $L_{SRC}$ 434— that is, at locations at which voltage measurements will include measurement of the $L_{CS}$ voltage 806. An amount of $L_{CS}$ voltage 806 decrease can be determined that corresponds to the beginning of the dV/dt phase. Accordingly, measurement of the $L_{CS}$ voltage 806 can be used by the dV/dt phase detection block 406 to perform dV/dt phase detection.

Modifications are possible in the described embodiments, and other embodiments are possible, within the scope of the claims.

In some examples, transistors other than FETS can be used.

In some examples, a power FET is a power metal-oxide-semiconductor FET (MOSFET), a Gallium Nitride (GaN) FET, or a Silicon Carbide (SiC) FET (or another type of FET).

In some examples, a FET other than a power FET can be turned on as described herein.

In some examples, a power FET or other FET turned on using the process(es) described above is included in a power converter other than a buck converter, such as a boost converter or buck-boost converter. In some examples, a power FET or other FET turned on using the process(es) described above is included in a circuit other than a power converter.

In some examples, a p-channel type or other type of power FET is used, with a correspondingly adjusted gate driving current; for example, a gate driving current that is inverted with respect to the gate current of FIG. 4.

In some examples, a resistive element other than a resistor is used to define the current $I_C$. In some examples, a resistive element (such as a resistor or programmable resistor or resistor array) used to define $I_C$ is located in a same integrated circuit as the power FET 404. In some examples, a resistive element used to define $I_C$ can be set by a software, firmware, or hardware based process.

In some examples, one or more of the source terminal 436 and the drain terminal 440 is one or more of a node, terminal, pin, pad, or via. In some examples, the source terminal 436 and the drain terminal 440 are respectively connected to the switch node and voltage source 102 as shown in FIG. 1. In some examples, the power FET drive circuit 400 and related connectivity (such as pins, pads, or other structures enabling external connection) are the predominant or only features on a die.

In some examples, a relatively low reference voltage is used as the ground 104.

In some examples, a power FET structure is used in which current flows vertically. In some examples, a power FET structure is used in which current flows horizontally.

In some examples, $I_{dV/dt}$ is a positive current that is less than $I_{dI/dt}$. In some examples, $I_{dV/dt}$ is a zero (no) current signal.

In some examples, the delay added by the delay cell 408 is set in firmware. In some examples, the delay added by the delay cell 408 is set in hardware.

In some examples, one or more of the source terminal 438, the drain terminal 440, and the control input terminal 442 corresponds to a connection from inside an integrated circuit that includes one or more of the gate driver 402, the power FET 404, the dV/dt phase detection block 406, and the delay cell 408, to outside the integrated circuit.

In some examples, the $I_{dV/dt}$ is selected so that the dV/dt phase lasts as long as possible pursuant to thermal and efficiency design parameters.

In some examples, $V_{PU}$ is the same as $V_{DRV}$.

What is claimed is:

1. An integrated circuit comprising:
- a first current source having a first current output;
- a second current source having a second current output;
- a first switch coupled between the first current output and a driver terminal, the first switch having a first switch control terminal;
- a second switch coupled between the second current output and the driver terminal, the second switch having a second switch control terminal; and
- a third switch coupled between the driver terminal and a reference terminal, the third switch having a third switch control terminal; and
- a control circuit including a control input and control outputs coupled to the first, second, and third switch control terminals, the control circuit configurable to:
  - responsive to the control input transitioning from a first state to a second state, enable the first switch to charge the driver terminal using the first current source and then enable the second switch to discharge the driver terminal using the second current source; and
  - responsive to the control input transitioning from the second state to the first state, enable the third switch to discharge the driver terminal.

2. The integrated circuit of claim 1, wherein the control input is a first control input, the control circuit has a second control input and the integrated circuit further includes a dV/dt phase detector having an output coupled to the second control input of the control circuit.

3. The integrated circuit of claim 2, further comprising a delay cell coupled between the output of the dV/dt phase detector and the second control input of the control circuit.

4. The integrated circuit of claim 1, further comprising a fourth switch and a resistor coupled between a power terminal and the driver terminal, the fourth switch having a fourth switch control terminal coupled to the control outputs, wherein the control circuit is configurable to:
- responsive the control input transitioning from the first state to the second state:
  - within a first interval, enable the first switch and disable the second, third, and fourth switches;
  - within a second interval after the first interval, enable the second switch and disable the first, third, and fourth switches; and
  - within a third interval after the second interval, enable the fourth switch and disable the first, second, and third switches; and
- responsive to the control input transitioning from the second state to the first state, enable the third switch and disable the first, second, and fourth switches.

5. The integrated circuit of claim 4, wherein the control input is a first control input, the control circuit has a second control input and configurable to:
- start the second interval responsive to the second control input indicating at least one of: a dI/dt phase of a transistor coupled to the driver terminal ends, a dV/dt phase of the transistor starts, or a current conducted by the transistor equals a threshold.

6. The integrated circuit of claim 1, wherein:
- the control input of the control circuit is a first control input of the control circuit; and
- the control circuit has a second control input and is configurable to set a first current provided by the first current source and a second current provided by the second current source based on a state of the second control input.

7. The integrated circuit of claim 6, wherein:
- the first current is larger than the second current.

8. The integrated circuit of claim 2, wherein the dV/dt detector includes:
- a first capacitor coupled between a first terminal and a second terminal;
- a second capacitor coupled between the second terminal and a third terminal; and
- a circuit coupled between the second terminal and the output of the dV/dt phase detector.

9. The integrated circuit of claim 8, further comprising a first diode coupled between the first terminal and the second terminal and a second diode coupled between the second terminal and the third terminal.

10. A method comprising:
- receiving a control signal;
- responsive the control signal transitioning from a first state to a second state:
  - within a first interval, providing a first current to charge a control terminal of a transistor; and
  - within a second interval after the first interval, providing a second current to discharge the control terminal of the transistor; and
- responsive the control signal transitioning from the second state to the first state, connecting the control terminal to a reference terminal to discharge the control terminal.

11. The method of claim 10, wherein the control signal is a first control signal, and the method further comprises:
- receiving a second control signal indicating at least one of: a dI/dt phase of the transistor ends, a dV/dt phase of the transistor starts, or a current conducted by the transistor equals a threshold; and
- starting the second interval responsive to the second control signal.

12. The method of claim 11, further comprising delaying for the second control signal, and starting the second interval responsive to the delayed second control signal.

13. The method of claim 11, wherein the second control signal is generated based on detecting a decrease in a voltage magnitude between current terminals of the transistor.

14. The method of claim 11, wherein the second control signal is generated based on detecting a decrease in a voltage magnitude across a common source inductance of the transistor.

15. The integrated circuit of claim 8, wherein the circuit includes at least one of: a comparator, or a Schmitt trigger.

16. An integrated circuit comprising:

a transistor having a first current terminal, a second current terminal, and a transistor control terminal; and a driver circuit having a driver terminal, the driver terminal coupled to the transistor control terminal, and the driver circuit including:

a first current source having a first current output;

a second current source having a second current output;

a first switch coupled between the first current output and the driver terminal, the first switch having a first switch control terminal;

a second switch coupled between the second current output and the driver terminal, the second switch having a second switch control terminal;

a third switch coupled between the driver terminal and a reference terminal, the third switch having a third switch control terminal; and a control circuit including a control input and control outputs, the control outputs coupled to the first, second, and third switch control terminals, the control circuit configurable to:

responsive to the control input transitioning from a first state to a second state, enable the first switch to charge the driver terminal using the first current source and then enable the second switch to discharge the driver terminal using the second current source; and responsive to the control input transitioning from the second state to the first state, enable the third switch to discharge the driver terminal.

17. The integrated circuit of claim 16, further comprising a fourth switch and a resistor coupled between a power terminal and the driver terminal, the fourth switch having a fourth switch control terminal coupled to the control outputs, wherein the control circuit is configurable to:

responsive the control input transitioning from the first state to the second state:

within a first interval, enable the first switch and disable the second, third, and fourth switches;

within a second interval after the first interval, enable the second switch and disable the first, third, and fourth switches; and within a third interval after the second interval, enable the fourth switch and disable the first, second, and third switches; and responsive to the control input transitioning from the second state to the first state, enable the third switch and disable the first, second, and fourth switches.

18. The integrated circuit of claim 17, wherein the control input is a first control input, the control circuit has a second control input, and is configurable to start the second interval responsive to the second control input indicating at least one of: a dI/dt phase of the transistor ends, a dV/dt phase of the transistor starts, or a current conducted by the transistor equals a threshold.

19. The integrated circuit of claim 16, wherein the control input is a first control input, the control circuit has a second control input, and the integrated circuit further comprises a dV/dt phase detector having an output coupled to the second control input.

20. The integrated circuit of claim 19, further comprising a delay cell coupled between the output of the dV/dt phase detector and the second control input.

21. The integrated circuit of claim 19, wherein the dV/dt phase detector includes a first capacitor coupled between the first current terminal and a third terminal, a second capacitor coupled between the third terminal and the second current terminal, and a circuit coupled between the second current terminal and the output of the dV/dt phase detector.

22. The integrated circuit of claim 21, wherein the circuit includes at least one of a comparator or a Schmitt trigger.

23. The integrated circuit of claim 16, wherein the transistor includes at least one of: a Gallium Nitride transistor, or a Silicon Carbide transistor.

* * * * *